United States Patent [19]
Riley, Jr. et al.

[11] Patent Number: 6,122,534
[45] Date of Patent: Sep. 19, 2000

[54] HIGH TEMPERATURE SUPERCONDUCTING COMPOSITE CONDUCTOR AND METHOD FOR MANUFACTURE OF SAME

[75] Inventors: Gilbert N. Riley, Jr., Marlborough, Mass.; James D. Cotton, Issaquah, Wash.; Terry G. Holesinger, Los Alamos, N. Mex.

[73] Assignee: The Regents of the Univeristy of California, Los Alamos, N. Mex.

[21] Appl. No.: 09/147,922

[22] PCT Filed: Sep. 23, 1997

[86] PCT No.: PCT/US97/16916

§ 371 Date: Mar. 18, 1999

§ 102(e) Date: Mar. 18, 1999

[87] PCT Pub. No.: WO98/14961

PCT Pub. Date: Apr. 9, 1998

Related U.S. Application Data

[60] Provisional application No. 60/044,461, Sep. 23, 1996.

[51] Int. Cl.[7] .............................. H01B 12/00; H01L 39/24
[52] U.S. Cl. ......................... 505/230; 505/231; 505/430; 505/500; 505/501; 505/704; 505/742; 29/599; 174/125.1
[58] Field of Search ..................................... 505/430, 433, 505/230, 231, 742, 704; 427/500, 501, 62; 29/599; 174/125.1

[56] References Cited

U.S. PATENT DOCUMENTS

| | | | |
|---|---|---|---|
| 5,304,534 | 4/1994 | Ciszek | 505/434 |
| 5,663,528 | 9/1997 | Tanaka et al. | 174/125.1 |
| 5,929,000 | 7/1999 | Hahakura et al. | 505/231 |

OTHER PUBLICATIONS

Shamoto et al, Jpn. J. Appl. Phys. vol. 26, No. 4 pp. L493–497, Apr. 1987.

*Primary Examiner*—Roy V. King
*Attorney, Agent, or Firm*—Bruce H. Cottrell

[57] ABSTRACT

A process for increasing the resistivity of a HTS oxide composite sheath including heating a superconductive HTS oxide composite, the composite including a sheath including silver, in the presence of mercury at temperatures sufficient to form a silver—mercury alloy is provided together with a HTS oxide composite which includes a high temperature superconductor oxide core surrounded by a metallic sheath, the metallic sheath including silver and mercury.

Also provided is a process for preparing a HTS oxide composite having an enhanced transport critical current density including placing the HTS oxide composite within a sealed, evacuated container, and, heating the HTS oxide composite for time and at temperatures sufficient for enhancement of transport critical current density in comparison to the transport critical current density of the HTS oxide composite prior to the heating.

13 Claims, 2 Drawing Sheets

HIGH TEMPERATURE SUPERCONDUCTING COMPOSITE CONDUCTOR AND METHOD FOR MANUFACTURE OF SAME

This application is a national stage of PCT/US97/16916, filed Sep. 23, 1997 and which claims the benefit of U.S. Provisional Application 60/044,461, filed Sep. 23, 1996.

FIELD OF THE INVENTION

The present invention relates to composite oxide superconductor articles having reduced AC losses and to a process for preparing such composite superconductor articles having reduced AC losses. This invention is the result of a contract with the Department of Energy (Contract No. W-7405-ENG-36).

BACKGROUND OF THE INVENTION

Recent advances in the development of high temperature superconducting (HTS) oxide composites have demonstrated the feasibility of oxide superconductor applications in power transmission cables, fault current limiters, utility inductors, motors and generators. However, a major impediment to such commercial applications of HTS conductors is the energy dissipation within the conductor associated with time varying electric and magnetic fields, referred to as AC losses. This limitation has commercial significance since many of the superconductor applications that have the greatest potential for energy conservation involve operating the superconductor in the presence of an AC magnetic field or require that the superconductor carry an AC current.

HTS wires typically are composite wires composed of superconductor filaments sheathed in a matrix of NORMAL or non-superconducting metal. In the presence of time varying, magnetic fields or currents, that is, alternating currents, a variety of mechanisms give rise to energy dissipation in composite superconductors. In particular, eddy current losses occur in the metal matrix that is enhanced by coupling between superconducting filaments.

In multifilamentary superconductors, eddy currents can be quite large. The physics governing AC losses in low temperature superconductor composite materials have been described and analyzed (see Wilson, "Superconducting Magnets", Ch. 8 (1983, 1990).

To minimize eddy currents, the matrix resistivity is preferably increased and the twist pitch of the superconducting filaments in a multifilamentary superconductor are preferably tightened, i.e., reduced. Eddy current losses may be reduced by increasing the resistivity of the metal matrix in close proximity to the superconductor filaments. High resistivity within the matrix diminishes eddy current ($i_e$) flow and consequently diminishes power loss (that is, reduced AC losses).

The prior art has not demonstrated the ability to increase matrix resistivity to the required level for reduction of AC losses while retaining desirable superconducting properties. Bulk resistivity within the matrix should be on the order of at least 1 micro-ohm centimeter ($\mu\Omega$-cm), and preferably 10 $\mu\Omega$-cm, at $T \leq T_c$, where $T_c$ is the critical current temperature of the HTS oxide, in order to have a significant effect on lowering eddy current losses. Pure silver has a resistivity on the order of about 0.1 $\mu\Omega$-cm. An approach to increasing matrix resistivity includes oxidation of a silver alloy (typically AgMg) to introduce oxide particles (MgO) into the silver matrix, known as oxygen dispersion strengthened (ODS) silver. Oxidation of Mg to MgO occurs in the early heat treatments of an HTS precursor composite during processing to the oxide superconductor. This produces resistivities on the order of 0.7 $\mu\Omega$-cm. Another approach to increasing matrix resistivity includes introducing a metallic barrier layer into the interior of an HTS precursor composite which is converted into a high resistivity phase (typically by oxidation) during processing of the composite into an oxide superconductor. Both of these approaches attempt to increase the bulk resistivity of the matrix while processing the precursor materials into the desired oxide superconductor.

There are technical difficulties in attempting to manufacture an oxide superconductor in the presence of or concurrent with the formation of a high resistivity matrix. For example, processing steps associated with formation of the high resistivity matrix may not be compatible with processing of the oxide superconductor. In particular, at the high temperatures used to form the oxide superconductor, many of the components likely to impart high resistivity to the matrix react with and/or poison the superconductor. Further, unacceptably large amounts of resistive material may be required to impart the required resistivity to the oxide superconductor composite matrix. In addition, materials which are both chemically compatible with the oxide superconductor and with the matrix (which is typically silver) are typically highly conductive. A need remains to prepare matrices of suitable high resistivity for use in HTS composites without negatively affecting the superconducting properties of the composite.

It is an object of the present invention to provide a HTS oxide composite having a non-superconducting metal sheath with increased resistivity, e.g., at least about 1 micro-ohm cm, preferably at least about 5 micro-ohm cm, most preferably at least about 10 micro-ohm cm.

It is a further object of the invention to provide a process for increasing the resistivity of the non-superconducting metallic sheath of a HTS oxide composite which is carried out after heat treatment of the HTS oxide composite to impart superconductivity.

Still another object of the invention is to provide a closed-system process for enhancing the transport critical current density of a HTS oxide composite.

SUMMARY OF THE INVENTION

To achieve the foregoing and other objects, and in accordance with the purposes of the present invention, as embodied and broadly described herein, the present invention provides a process for increasing the resistivity of a HTS oxide composite sheath including heating a superconductive HTS oxide composite, the composite including a sheath comprising silver, in the presence of mercury at temperatures sufficient to form a silver—mercury alloy.

Further, the present invention provides a HTS oxide composite including a high temperature superconductor oxide core surrounded by a metallic sheath comprised of silver and mercury. Preferably, the mercury comprises at least 1.25 atomic percent of the silver in the sheath. In such an embodiment, the metallic sheath can be characterized as having a resistivity of greater than about 1 micro-ohm cm, preferably greater than about 5 micro-ohm cm, and most preferably greater than about 10 micro-ohm cm.

In another aspect of the present invention, the HTS oxide composite can have a mercury concentration gradient across a predominantly silver sheath, the mercury concentration greater in portions of the sheath situated nearest the outside of the sheath and the mercury concentration decreasing in portions of the sheath further from the outside of the sheath.

The present invention also provides a closed-system process for preparing a HTS oxide composite having an enhanced transport critical current density including placing the HTS oxide composite within a sealed, evacuated container, and, heating the HTS oxide composite for time and at temperatures sufficient for enhancement of transport critical current density in comparison to the transport critical current density of the HTS oxide composite prior to the heating. Methods for post-processing HTS oxide composites in an open system with a continuously introduced flowing atmosphere with low oxygen partial pressure are known and have been shown to enhance transport critical current density. However, process control in those systems is more difficult than it would be in a closed system.

DETAILED DESCRIPTION

Figure 1:
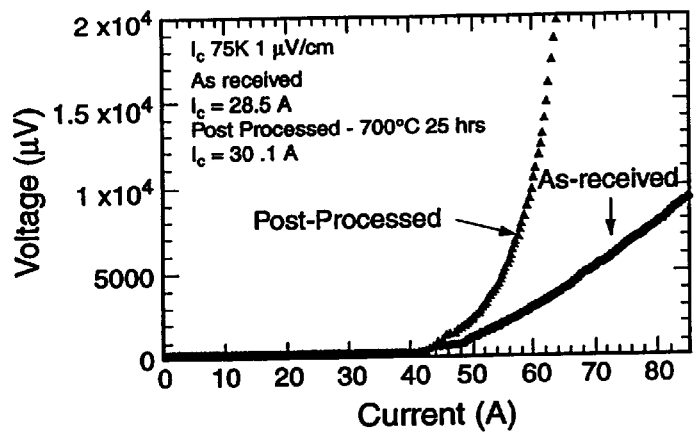
FIG. 1 is an $I_c$ plot of current versus voltage for HTS oxide composite tape both before and after addition of mercury to the sheath illustrating the increased resistivity of the sheath at high voltages.
Figure 2:
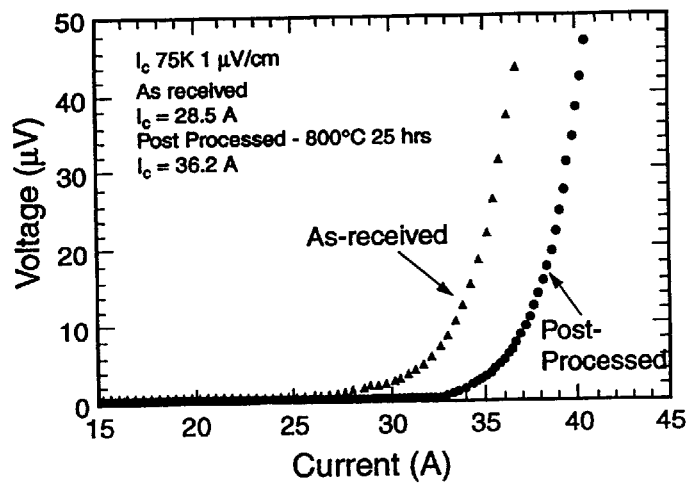
FIG. 2 is a graph illustrating the increase in transport critical current density at low voltages for HTS oxide composite tape both before and after addition of mercury to the sheath at processing temperatures of 800° C.

The present invention is concerned with a process for preparation of a composite oxide superconductor article having reduced AC losses and to such composite oxide superconductor article having reduced AC losses. In particular, the present invention is concerned with post-processing of HTS oxide composites with mercury and additional post-processing treatments after the post-processing with mercury.

In one aspect of the invention, such post-processing can provide increased resistivity to silver-containing sheath materials. In another aspect of the invention, mercury in such post-processing can serve as a binder to join or fuse multiple HTS oxide composites together whereby a monolithic rigid structure is formed, such a structure characterized by increased strength in comparison to un-joined or un-fused HTS oxide composites. In still another aspect of the invention, post-processing with mercury can serve to cure or fill minor defects such as small holes or cracks in the metallic sheath of such HTS oxide composites. In yet another aspect of the invention, such post-processing with mercury can yield HTS oxide composites with varying resistivity in different portions of the HTS oxide composite.

By "post-processing", as that term is used herein, is meant any processing of a HTS oxide composite at a time after such a HTS oxide composite has undergone sufficient treatments to obtain superconductive properties, e.g., after a HTS oxide composite tape has been reduced to a desired size by rolling, drawing, swaging and the like and heat treated under suitable temperatures and suitable atmospheric content to yield a superconducting product.

By "resistivity", as that term is used herein, is meant the electrical resistance ($\Omega$) of the matrix as measured over a distance (cm). The distance spans across large regions (mm and/or cm scale) of the matrix and therefore is a measurement of the bulk resistivity of the matrix.

"High resistivity matrix", as that term is used herein, means a matrix including a high resistivity component. "High resistivity" refers to the bulk resistivity of the matrix which is the resistivity experienced across the large regions (mm and/or cm scale) of the matrix.

HTS composites of the present invention advantageously exhibit reduced AC current losses, and in particular, exhibit reduced eddy current losses and eddy current heating. HTS oxide composites of the present invention may also exhibit improved mechanical properties as compared to composites containing non-treated matrices or matrices where the high resistivity component is localized along the grain boundaries. High resistivity matrix/oxide superconductor composites of the present invention are useful conductors in magnetic field and direct and alternating current carrying applications. According to the method of the present invention, the additives are introduced into the metal matrix after all significant processing of the oxide superconductor is complete, thereby obviating the problems associated with the presence of high resistivity alloys during processing of the HTS oxide composite. In particular, the matrix is not required to have high oxygen permeability, a solidus temperature at the sintering temperature of the oxide superconductor (typically >800° C.) and low toxicity to the oxide superconductor.

Experiments were performed on 85-filament Bi-2223/Ag tapes manufactured by American Superconductor Corporation (ASC). The tapes were prepared at ASC by a standard OPIT process. See, for example, Superconducting Science and Technology, Vol. 5, pp. 318–326, 1992; C. H. Rosner et al., "Status of HTS superconductors: Progress in improving transport critical current densities in HTS Bi-2223 tapes and coils" (presented at conference 'Critical Currents in High Tc Superconductors', Vienna, Austria, April, 1992) and K. Sandhage et al., "Critical Issues in the OPIT Processing of High Jc BSCCO Superconductors", Journal of Metals, 43, 21, 1991, all of which are herein incorporated by reference. The tapes might equally well have been made by other well-known long-length processes such as MPIT tape casting of thin films or laminations. Any desired HTS oxide may be used.

The invention may be practiced with any desired oxide superconductor. Suitable high temperature superconductive (HTS) oxide ceramic materials include bismuth-based superconductive materials such as a bismuth—strontium—calcium—copper oxide, e.g., $Bi_2Sr_2Ca_2Cu_3O_x$ (Bi-2223) or $Bi_2Sr_2Ca_1Cu_2O_x$, (Bi-2212) or a bismuth—lead—strontium—calcium—copper oxide, e.g., $(Bi_{2-x}Pb_x)Sr_2Ca_2Cu_3O_x$, from rare earth-based superconductive materials including yttrium-based superconductive materials such as a yttrium—barium—copper oxide, e.g., $YBa_2Cu_3O_x$, or from thallium-based superconductive materials such as a thallium—barium—copper oxide, e.g., $Tl_2Ba_2Ca_2Cu_3O_x$. Numerous other oxide superconductive compositions are well known as exemplified by $MBa_2Cu_3O_x$ where M is neodymium (Nd), dysprosium (Dy), erbium (Er), thulium (Tm), gadolinium (Gd), samarium (Sm), europium (Eu), ytterbium (Yb), holmium (Ho) or mixtures thereof, $La_{2-x}Sn_xCuO_4$, $La_2CuO_4$ doped with fluorine, $YBa_2Cu_3O_x$ doped with fluorine, $EuBa_2(Cu_{1-y}M_y)_3O_x$ where M is chromium (Cr), manganese (Mn), cobalt (Co), nickel (Ni) or zinc (Zn), and $BaKBiO_3$. Those acquainted with the art will appreciate that the list of superconductors, especially high temperature ceramic-type oxide superconductors, is long and continues to grow on a regular basis and that basic high temperature ceramic-type oxide superconductor compositions may generally be doped with various metals, metalloids and non-metals. The addition of doping materials, including but not limited to the optional materials identified above, variations in proportions and such other variations in the precursors of the desired superconducting oxides as are well known in the art, are also within the scope and spirit of the invention. Members of the BSCCO family of superconductors such as $Bi_2Sr_2Ba_1Cu_2O_x$ (BSCCO-2212), $Bi_2Sr_2Ca_2Cu_3O_x$ (BSCCO-2223), or $(Bi, Pb)_2Sr_2Ca_2Cu_3O_x$, are among the superconducting oxides most preferred as the HTS oxide material in the present invention.

The invention may be practiced with any suitable silver-containing sheath. In addition to the silver in the sheath, other materials such as magnesium, aluminum, palladium or gold may be present.

Tapes were prepared by packing the powder into cylindrical silver billets, which were deformed into tape using standard deformation techniques, including wire drawing to a hexagonal shape, repacking an 85 filament bundle into a silver tube, wire drawing, and rolling. For monofilament tapes the rebundling step was omitted. The samples were given multiple heat treatments at temperatures between 800° C. and 830° C. in 7.5% oxygen with intermediate deformations consisting of pressing for the monofilament tapes and rolling for the multifilament tapes. The final dimensions of the monofilament tape are 100 μm thick by about 3 millimeter (mm) wide with an about 35–40 μm thick core and a 20% fill factor. The 85 filament tape has dimensions within the ranges of 100 to 300 μm in thickness and 2.0 to 5.0 mm in width with filament dimensions from 3 to 15 μm in thickness and 80 to 400 μm in width and with a fill factor from 15 to 45 percent.

The processing conditions in the present invention include temperature, time, pressure and atmosphere content.

Generally, the amount of mercury metal is at least 1.25 atomic percent of the silver in the sheath, and preferably from about 5 to about 40 weight percent of the final alloy composition.

In the process of the present invention, the mercury is added after the HTS oxide composite is initially heat treated to impart the superconductive properties. The process for increasing the resistivity of the composite sheath must not detrimentally impact the superconductive properties. For purposes of the present discussion the term "HTS oxide composite" refers to a rolled superconductive tape that has already been heat treated to obtain the superconductive properties.

In the present process of increasing the resistivity of a HTS oxide composite sheath, mercury addition can be accomplished by heating the HTS oxide composite in the presence of mercury. One preferred manner of conducting the process is to place the HTS oxide composite into a container including a predetermined amount of mercury. The container is preferably a sealed container so that upon heating the mercury will gradually be vaporized and the mercury vapors can react and diffuse into the silver sheath.

Another manner of conducting the present invention is initially to dip or coat the HTS oxide composite with mercury, followed by placing the mercury coated HTS oxide composite into a sealed container and heating at temperature sufficient to diffuse the mercury into the composite sheath. During the heating stage to allow the formation of the silver—mercury alloy, a sub-atmospheric gas pressure of oxygen and mercury vapor will be formed in situ from the oxygen in the superconductive material and the mercury-containing material. Heating under such a gas pressure including this oxygen partial pressure has been found to result in enhancement of the transport critical current density.

Diffusion temperatures for the reaction of the mercury with the metal sheath to from the silver—mercury alloy are typically from about 600° C. to the temperature whereat the HTS oxide substantially decomposes, typically about 850° C. for BSCCO 2223, about 875° C. for BSCCO 2212 and about 900° C. for YBCO 123, preferably from about 700° C. to the temperature whereat the HTS oxide begins to decompose. At temperatures beneath about 600° C. the diffusion rate is generally too slow or absent. At temperatures above the decomposition temperature of the HTS oxide, the superconductive properties of the HTS oxide composite can be affected. Generally, the preferred temperature range for BSCCO 2223 is from about 700° C. to about 825° C. The selected temperature can be chosen based on the particular effect desired to predominantly result. For the highest resistivity values, temperatures of about 800° C. are generally preferred. Temperatures for the greatest enhancement in transport critical current densities of the composite will be dependent upon the particular HTS oxide chosen for the composite. Temperatures of about 800° C. are generally preferred for greatest enhancement of transport critical current densities in BSCCO 2223.

In some instances, it has been found that when the amount of mercury added to the sheath is great, e.g., above about 25 weight percent, the critical current can be slightly decreased or degraded. In those cases where critical current is decreased by mercury post-processing, a subsequent anneal at low temperatures, at from about 200° C. to about 600° C., preferably at around 300° C., in an ambient atmosphere or in an atmosphere containing about 10 percent by volume oxygen, can generally restore the critical current values to the HTS oxide composite. Such an anneal can be accomplished in as short as a few hours, generally about 4 to 6 hours. Longer anneals may be necessary for larger monoliths.

Transport critical current densities have been found to be enhanced in part both by the addition of mercury and by the processing of the HTS oxide composite in a sealed evacuated container wherein a less than atmospheric pressure atmosphere is typically formed from oxygen within the HTS oxide cores. The enhancement of transport critical current densities is generally best with both the addition of mercury and the processing in the sealed evacuated container, but the major enhancement is obtained by the processing in the sealed evacuated container.

For such processing of the HTS oxide composite, the HTS oxide composite is preferably placed into a sealed evacuated container. The sealed container should be pumped or otherwise evacuated to a low total pressure less than about 100 Torr, preferably less than about 1 Torr. Heating temperatures are typically from about 700° C. up to the temperature whereat the HTS oxide begins to decompose. Generally, a processing time of from about 1 hour to about 100 hours is sufficient for enhancement of the transport critical current density. During the heating stage, a partial pressure of oxygen will be formed in situ. Because the reaction takes place in a closed system, it is self-limiting and extremely precise control of processing conditions is not required.

The time for reaction or diffusion of the mercury into the silver can be varied depending upon the diffusion temperature and depending upon the precise effect desired. Generally, from about 1 hour to about 300 hours, preferably from about 25 hours to about 100 hours is sufficient for the diffusion of the mercury to occur.

In another aspect of mercury post-processing, multiple HTS oxide composite tapes can be joined, bonded or fused together with mercury. The joining or bonding can be carried out at room temperature. Subsequently, the bonded article can be heat-treated at elevated temperatures, generally at from about 600° C. to the temperature whereat the HTS oxide substantially decomposes, preferably from about 700° C. to the temperature whereat the HTS oxide begins to decompose, most preferably at about 800° C., to yield a structurally rigid monolith. The monolith has increased structural strength in comparison to individual HTS oxide composites. Such an article may be desired where an HTS oxide composite article such as a current lead or coil must undergo everyday handling or endure the stresses of high magnetic fields.

Figure 4:
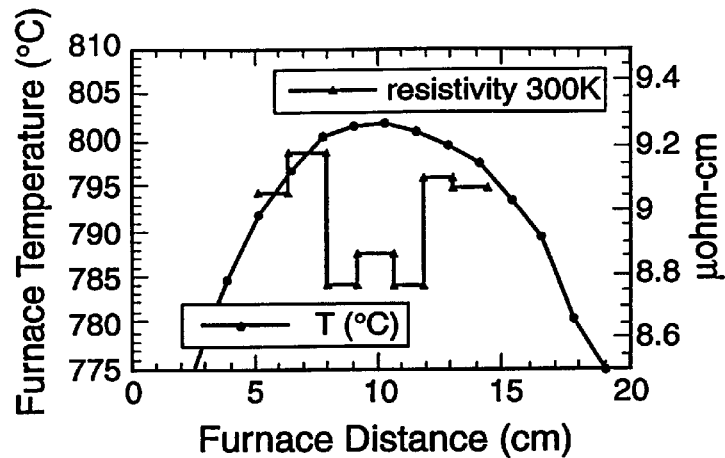
FIG. 4 is a graph illustrating a plot of resistivity of a resultant sheath versus location within the furnace and corresponding furnace temperature at that location.

In another aspect, it has been found that the resistivity in different portions of a HTS oxide composite can be controllably varied. Such a result can be achieved by applying a temperature gradient across the dimensions, e.g., length, of the HTS oxide composite. By varying the temperature by as little as 15° C. across a portion of a HTS oxide composite, the resistivity can be varied. In FIG. 4, the results of a run wherein the post-processing of a HTS oxide composite tape with mercury was carried out within a temperature gradient within the furnace is shown. It is seen that resistivity can be varied across a composite tape. Varying the resistivity in different portions of the HTS oxide composite may be important in facilitating current transfer into the superconductor. Ideally, a HTS oxide composite tape can have low resistivity ends to facilitate current transfer while having a high resistivity middle region. The resistivity may also be varied by masking portions of the HTS oxide composite during the post-processing with the mercury whereby less mercury may be incorporated into the sheath at the masked areas and such areas would have lower resistivity.

Figure 5:
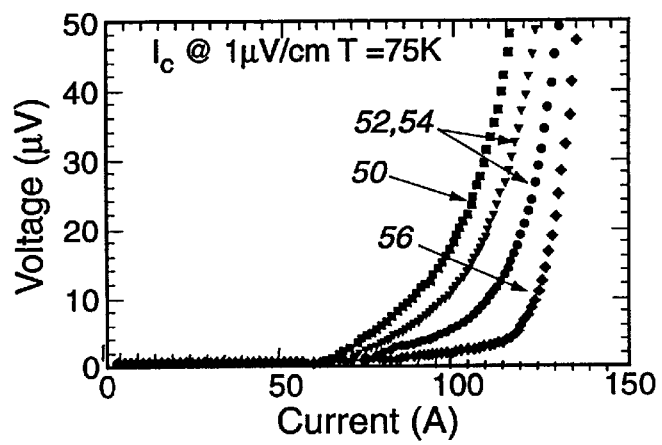
FIG. 5 shows the IV curves for a HTS oxide composite, the HTS oxide composite post processed in a sealed evacuated container at 800° C. for 25 hours with the addition of mercury sufficient to target a final composition with 15 weight percent mercury.
Figure 6:
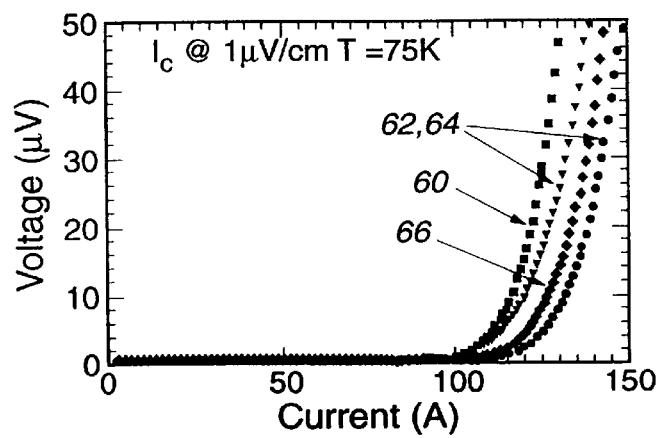
FIG. 6 shows the IV curves for another HTS oxide composite, the HTS oxide composite post processed in a sealed evacuated container at 800° C. for 25 hours with the addition of mercury sufficient to target a final composition with 15 weight percent mercury, but with the ends of the composite wrapped with silver foil during the processing.

FIG. 5 and FIG. 6 show the IV curves for a pair of HTS oxide composites. The composites of these figures were prepared from multiple tapes by spreading an amount of mercury sufficient to wet the tapes, stacking the wetted tapes and heating at 800° C. for 25 hours. In FIG. 5, a problem of current transfer into and out of the superconductor is indicated by the resistive feet on the outside sections of the composite. Line 50 is the plot for the entire length of the composite. Lines 52 and 54 are the plots for the end sections of the composite and line 56 is the plot for the middle section of the composite. The composite of FIG. 6 was post-processed with the ends of the composite wrapped in silver. This masking is believed to have prevented additional mercury from incorporating into the ends thereby resulting in low resistivity end regions. In FIG. 6, line 60 is the plot for the entire length of the composite, lines 62 and 64 are the plots for the end sections of the composite and line 66 is the plot for the middle section of the composite. The absence of the resistive feet is seen in FIG. 6.

Post-processing with mercury can also be used to cure or heal minor defects in the sheath. Such defects may be small holes, cracks or other porosity in the sheath.

The present invention is more particularly described in the following examples which are intended as illustrative only, since numerous modifications and variations will be apparent to those skilled in the art. The resistivity of the samples was determined using a standard four point resistivity technique. The transport critical current density of the samples was measured as the value at 75 K for 1 microvolt of current per centimeter of sample. Note that 75 K is the boiling point temperature for liquid nitrogen at the elevation of Los Alamos, N. Mex.

EXAMPLE 1

A quartz chamber included two segments, a first segment about 15 centimeters in length and a second segment about 3 centimeters in length, the segments joined to form a single container was used as a reaction vessel. Two segments of HTS oxide composite tape (from different batches), were weighed, folded in half and placed on edge within the larger section of the segmented quartz chamber. The on-edge orientation allowed diffusion from both sides of the tapes. Based on the weight of the tape samples, an amount of mercury that would be sufficient upon reaction with the tapes to increase the weight of the tapes by about 15 percent by weight was measured and placed into within the smaller section of the segmented quartz chamber. The chamber was evacuated to between about 1 to 5 milliTorr, backfilled with argon gas, again evacuated to between about 1 to 5 milliTorr, and the quartz chamber then sealed. The chamber was then heated at a rate of 2° C. per minute to a highest temperature of 800° C., held at that temperature for a period of 25 hours and then cooled at a rate of 1° C. per minute to room temperature. One of the sample tapes (length about 2 inches and thickness about 175 $\mu$m) had a weight gain of 23 percent by weight following reaction with the mercury. Resistivity of that sample tape was measured as 7.1 micro-ohm cm at 75 K. The other sample tape (length about 20 inches and thickness about 275 $\mu$m) had a weight gain of less than about 7 percent by weight.

EXAMPLE 2

Another sample tape was processed in accordance with example 1 with the difference that the highest temperature was 700° C. for about 25 hours. The sample tape had a weight gain of 12.35 percent by weight following reaction with the mercury. Resistivity was measured as 3.26 micro-ohm cm. Compositional measurements showed a mercury gradient across the sample with more mercury found on the outside portions of the sample.

EXAMPLE 3

Figure 3:
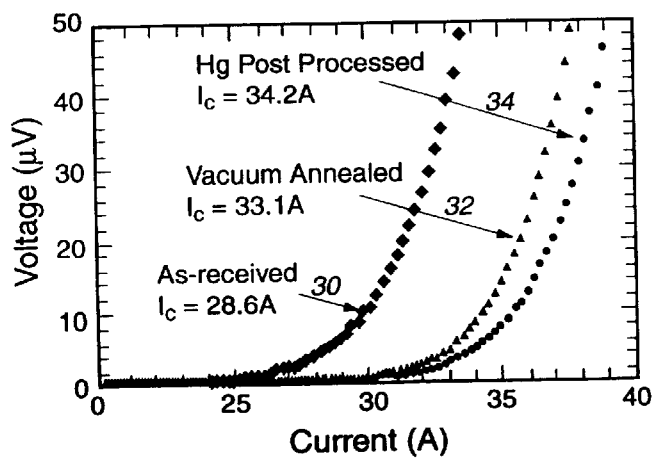
FIG. 3 is a graph illustrating the IV curves of an initial HTS oxide composite tape, the HTS oxide composite tape post processed in a sealed evacuated container at 800° C. for 25 hours without the addition of mercury, and the HTS oxide composite tape post processed in a sealed evacuated container at 800° C. for 25 hours with the addition of mercury.

To examine the effects of post-processing without the addition of mercury, a HTS oxide composite tape about 20 centimeters in length was weighed, folded in half and placed on edge within a quartz chamber. The chamber was evacuated to between about 1 to 5 milliTorr, backfilled with argon gas, again evacuated to between about 1 to 5 milliTorr, and the quartz chamber then sealed. The chamber was then heated at a rate of 2° C. per minute to a highest temperature of 800° C., held at that temperature for a period of 25 hours and then cooled at a rate of 1° C. per minute to room temperature. The sample tape had an improvement in transport critical current density following the heat treatment in the closed system in comparison to the transport critical current density prior to the heat treatment in the closed system. The results of this example are shown in FIG. 3 with line 30 showing the plot for the initial HTS oxide composite sample, line 32 showing the plot for the sample after the processing of this example and line 34 showing the plot for the sample processed as in this example with the addition of about 15 percent by weight mercury.

Other samples were processed in accordance with example 1 with variations in the temperature or the length of heating. The control samples were without any treatment of the initial HTS oxide composite sample. In addition, samples of silver tape were processed in accordance with example 1 and the resultant resistivity of the silver tape samples measured. The resultant increase in resistivity demonstrated that the changes in resistivity of the sheaths including the superconductive oxide material cores are attributable to the addition of mercury and not to some reaction between the oxide cores and the sheath material. The results are shown below in Table 1. It can be seen that processing at 800° C. for 25 hours increased the transport critical current density from the control of 28.5 A to 36.2 A, an increase of about 27 percent.

TABLE 1

| Sample | T (° C.) | time (hrs) | 300 K $\mu\Omega$-cm | 75 K $\mu\Omega$-cm | wt gain % | $I_c$ (A) @ 75 K |
|---|---|---|---|---|---|---|
| HTS #1 | control | control | 2.37 | 0.42 | N.A. | 28.5 |
| Ag #1 | control | control | 1.64 | 0.28 | N.A. | N.A. |
| HTS #2 | 600° C. | 25 | 7.57 | 1.21 | 11.62 | 31.5 |
| Ag #2 | 600° C. | 25 | 3.83 | 1.83 | 11.62 | N.A. |
| HTS #3 | 700° C. | 25 | 8.31 | 3.26 | 12.35 | 30.1 |
| Ag #4 | 700° C. | 25 | 6.74 | 4.76 | 12.35 | N.A. |
| HTS #5 | 700° C. | 100 | 8.69 | 3.73 | 13.3 | 27.2 |
| Ag #5 | 700° C. | 100 | 6.55 | 4.67 | 13.3 | N.A. |
| HTS #6 | 800° C. | 25 | 7.75 | 2.67 | 12.19 | 36.2 |
| Ag #6 | 800° C. | 25 | 5.79 | 3.9 | 12.19 | N.A. |

Although the present invention has been described with reference to specific details, it is not intended that such details should be regarded as limitations upon the scope of the invention, except as and to the extent that they are included in the accompanying claims.

What is claimed is:

1. A process for increasing the resistivity of a HTS oxide composite sheath comprising heating a superconductive HTS oxide composite, said composite including HTS oxide material and said sheath comprising silver, in the presence of mercury at temperatures sufficient to form a silver—mercury alloy in the sheath.

2. The process of claim 1 wherein said heating is conducted in sub-atmospheric pressure in a closed container.

3. The process of claim 1 wherein said heating is at temperatures from about 600° C. to beneath the decomposition temperature of the HTS oxide material.

4. The process of claim 1 wherein said composite sheath is coated with mercury prior to said heating.

5. A HTS oxide composite comprising a high temperature superconductor oxide core surrounded by a metallic sheath, said metallic sheath comprised of silver and mercury.

6. The HTS oxide composite of claim 5 wherein said metallic sheath is characterized as having a resistivity of greater than about 1 micro-ohm cm.

7. The HTS oxide composite of claim 5 wherein said metallic sheath is characterized as having a resistivity of greater than about 5 micro-ohm cm.

8. The HTS oxide composite of claim 5 further characterized as having a mercury concentration gradient across a predominantly silver sheath, said mercury concentration greater in portions of the sheath situated nearest the outside of said sheath and said mercury concentration decreasing in portions of the sheath further from the outside of said sheath.

9. The HTS oxide composite of claim 5 wherein said composite includes multiple HTS oxide composite tapes bound together by mercury into a monolith characterized by increased structural strength in comparison to an individual HTS oxide composite tape.

10. The HTS oxide composite of claim 5 wherein said composite is a tape, said tape characterized as having varied resistivity in different regions of said metallic sheath.

11. The HTS oxide composite of claim 10 further characterized as having lower resistivity at end regions of said tape than within the middle region of said tape.

12. A process for preparing a HTS oxide composite having an enhanced transport critical current density comprising:

placing a HTS oxide composite comprising a high temperature superconductor core surrounded by a metallic sheath including silver within a sealed, evacuated container; and heating said HTS oxide composite for time and at temperatures sufficient for enhancement of transport critical current density in comparison to the transport critical current density of said HTS oxide composite prior to said heating.

13. The process of claim 12 wherein said heating of said HTS oxide composite is in the presence of mercury and said temperatures are sufficient to form a silver—mercury alloy in the sheath.

* * * * *